US012672539B2

(12) United States Patent
Wong et al.

(10) Patent No.: US 12,672,539 B2
(45) Date of Patent: Jun. 30, 2026

(54) THIN FILM RESISTOR, THERMISTOR AND METHOD OF PRODUCING THE SAME

(71) Applicant: GlobalFoundries Singapore Pte. Ltd., Singapore (SG)

(72) Inventors: Qiying Wong, Singapore (SG); Handoko Linewih, Singapore (SG); Phyllis Shi Ya Lim, Singapore (SG); Chen Wai Samuel Chow, Singapore (SG); Yudi Setiawan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 404 days.

(21) Appl. No.: 18/336,412

(22) Filed: Jun. 16, 2023

(65) Prior Publication Data

US 2024/0421074 A1     Dec. 19, 2024

(51) Int. Cl.
*H10W 20/40*       (2026.01)
*H10D 1/47*        (2025.01)
*H10W 20/42*       (2026.01)

(52) U.S. Cl.
CPC .......... *H10W 20/498* (2026.01); *H10D 1/472* (2025.01); *H10D 1/474* (2025.01); *H10W 20/42* (2026.01)

(58) Field of Classification Search
CPC . H01L 23/5228; H01L 23/5226; H10D 1/472; H10D 1/474; H10W 20/498; H10W 20/42
See application file for complete search history.

(56) References Cited

U.S. PATENT DOCUMENTS

| | | | |
|---|---|---|---|
| 4,510,178 A | 4/1985 | Paulson et al. | |
| 6,098,464 A | 8/2000 | Avisse et al. | |
| 6,171,922 B1 | 1/2001 | Maghsoudnia | |
| 6,400,252 B1 | 6/2002 | Smith et al. | |
| 8,356,514 B2 | 1/2013 | Wang et al. | |
| 8,754,501 B2 | 6/2014 | Khan et al. | |
| 9,921,110 B2 | 3/2018 | Meinel et al. | |
| 2007/0008062 A1 | 1/2007 | Fivas et al. | |
| 2013/0341759 A1* | 12/2013 | Khan ........................ | H10D 1/47 257/533 |
| 2014/0239445 A1* | 8/2014 | Nishimura ............. | H10D 1/692 257/532 |

* cited by examiner

*Primary Examiner* — Patricia D Valenzuela

(57) ABSTRACT

An apparatus includes a resistor structure within a back end of line (BEOL) via level. The resistor structure includes a lower resistor film, a first insulating layer over the lower resistor film, an upper resistor film over the first insulating layer, and a second insulating layer over the upper resistor film. First and second upper metal lines are above the second insulating layer, a first end of the upper resistor film is coupled to the first upper metal line by a first upper via or contact, and a second end of the upper resistor film is coupled to the second upper metal line by a second upper via or contact. The apparatus may be a resistor or a thermistor of a semiconductor device.

20 Claims, 17 Drawing Sheets

116, 120,
216, 220

Contact
points

208

204

200

214c

212c

214b 210b  210b

222

220

218

216

210a  210a

212b

214a

212a

202b

202c

202a

202b

208

THIN FILM RESISTOR, THERMISTOR AND METHOD OF PRODUCING THE SAME

BACKGROUND

Very large scale integration (VLSI) circuits require dense arrays of fixed high-resistance resistors. These resistors are typically formed along with transistor devices in front end of line (FEOL) processes. High-resistance resistors in VLSI circuits are typically made of polysilicon.

Another application of resistors in semiconductor devices is in thermistors. Processors of computing devices use integrated thermistors to control operations to prevent excessive and damaging temperatures, and automotive equipment and biomedical devices benefit from temperature sensing components that are integrated with logic circuits. The compact size of these thermistors allows them to be placed close to heat sources or be integrated close to other circuits for thermal compensation and in-situ temperature sensing. Integration with semiconductor devices eliminates the need for additional components and wiring.

Conventional resistors are formed in front end of line (FEOL) processes alongside transistors and other devices. In addition, conventional resistor materials and configurations require extended line lengths to have desired resistance characteristics. Accordingly, conventional resistors occupy a substantial amount of area on a substrate.

SUMMARY

Embodiments of the present disclosure relate to thin film resistors and methods for producing thin film resistors. The thin film resistors can be applied to VLSI or thermistor circuits, for example.

In an embodiment, an apparatus includes a thin film resistor structure within a back end of line (BEOL) via level, the thin film resistor structure comprising a lower resistor film, a first insulating layer over the lower resistor film, an upper resistor film over the first insulating layer, and a second insulating layer over the upper resistor film, and first and second upper metal lines above the second insulating layer, wherein a first end of the upper resistor film is coupled to the first upper metal line by a first upper via, and a second end of the upper resistor film is coupled to the second upper metal line by a second upper via. The apparatus may be a thermistor.

In another embodiment, an apparatus includes a thin film resistor structure within a back end of line (BEOL) via level, the thin film resistor structure comprising a lower resistor film, a first insulating layer over the lower resistor film, an upper resistor film over the first insulating layer, and a second insulating layer over the upper resistor film, and first and second upper metal lines above the second insulating layer, wherein a first end of the upper resistor film is coupled to the first upper metal line by a first upper contact, and a second end of the upper resistor film is coupled to the second upper metal line by a second upper contact. The apparatus may be a resistor device.

In an embodiment, a method includes forming a lower metal layer including first and second lower metal lines, forming a thin film resistor structure by: forming a lower resistor film over the lower metal layer, forming a first insulating layer over the first resistor film, forming an upper resistor film over the first insulating layer, and forming a second insulating layer over the second resistor film, forming first and second upper vias that extend through the upper resistor film to contact first and second ends of the upper resistor film, respectively, and forming first and second upper metal lines coupled to the first and second upper vias, respectively.

DETAILED DESCRIPTION

A detailed description of embodiments is provided below along with accompanying figures. The scope of this disclosure is limited by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Reference is made below to the figures, which are not drawn to scale. The same reference numbers are used throughout different figures to designate the same or similar components.

Figure 2:
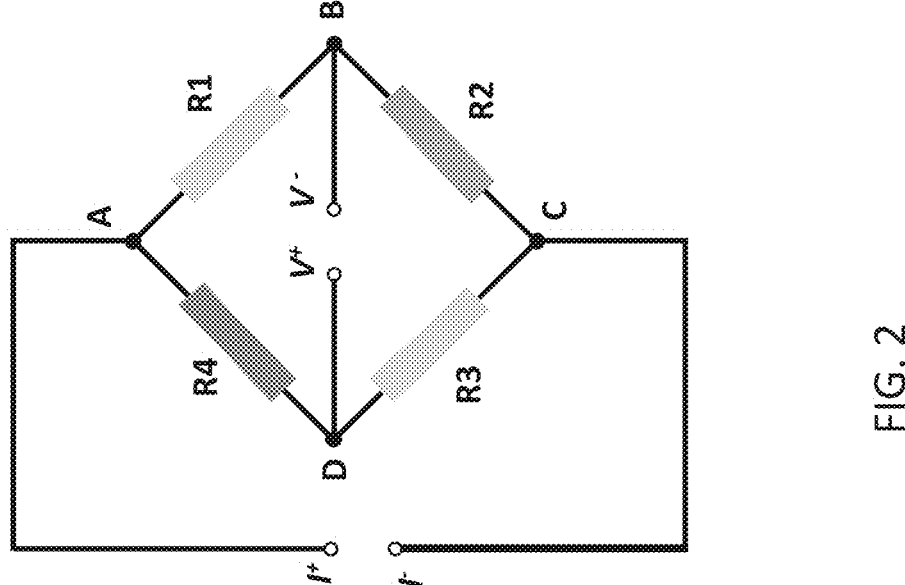
FIG. 2 illustrates a wheatstone bridge circuit according to an embodiment.
Figure 1:
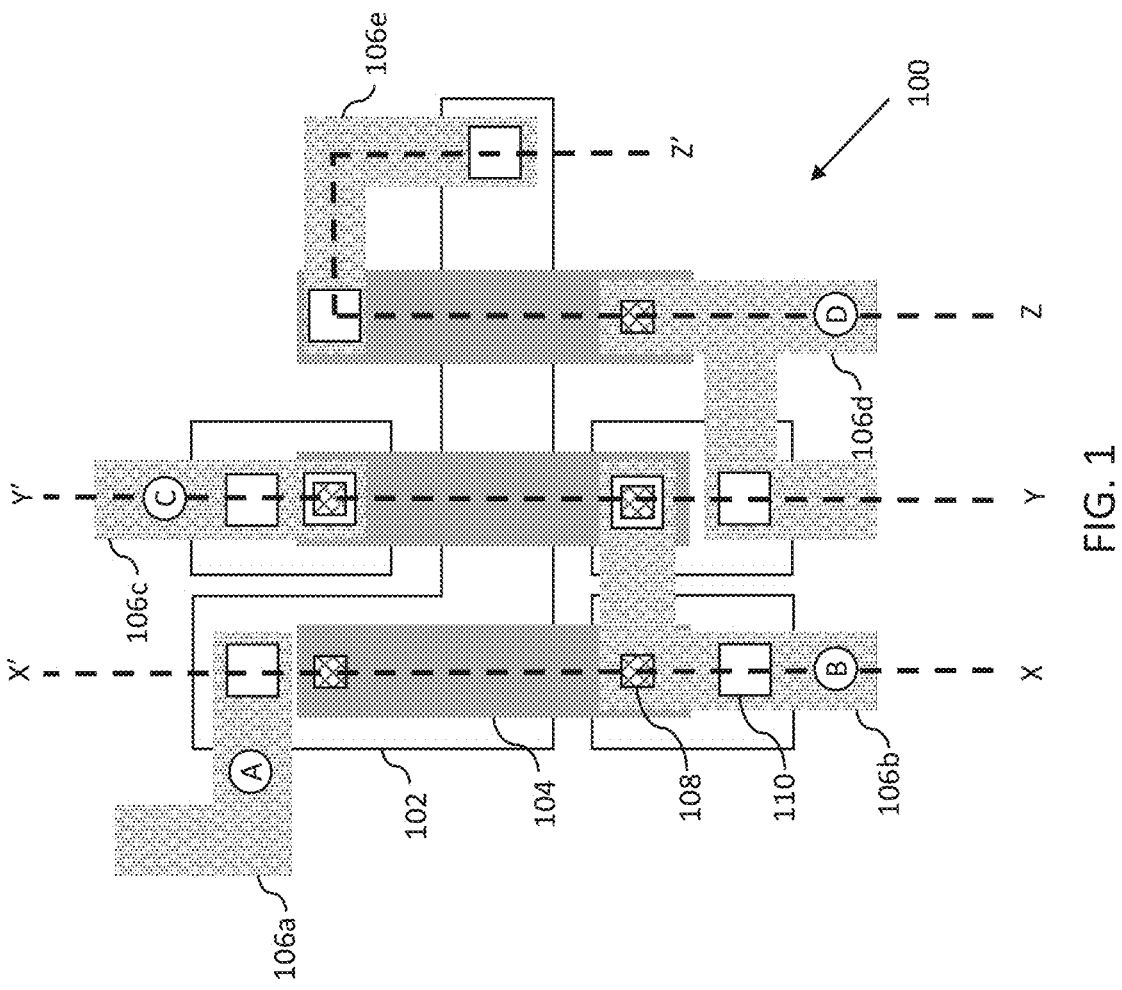
FIG. 1 illustrates a layout diagram of a thermistor according to an embodiment.

FIG. 1 is a layout diagram of a thermistor 100 according to an embodiment of the present disclosure. The thermistor 100 is arranged as a wheatstone bridge circuit comprising a first resistor R1, a second resistor R2, a third resistor R3, and a fourth resistor R4 as illustrated in FIG. 2. Resistor R1 comprises the same material as resistor R3, and resistor R2 comprises the same material as resistor R4. Points A, B, C and D in the layout diagram of FIG. 1 correspond to points A, B, C and D in the wheatstone bridge circuit of FIG. 2. Although the wheatstone bridge in FIG. 2 is a full wheatstone bridge, half wheatstone bridge circuits are within the scope of this disclosure.

Figure 3:
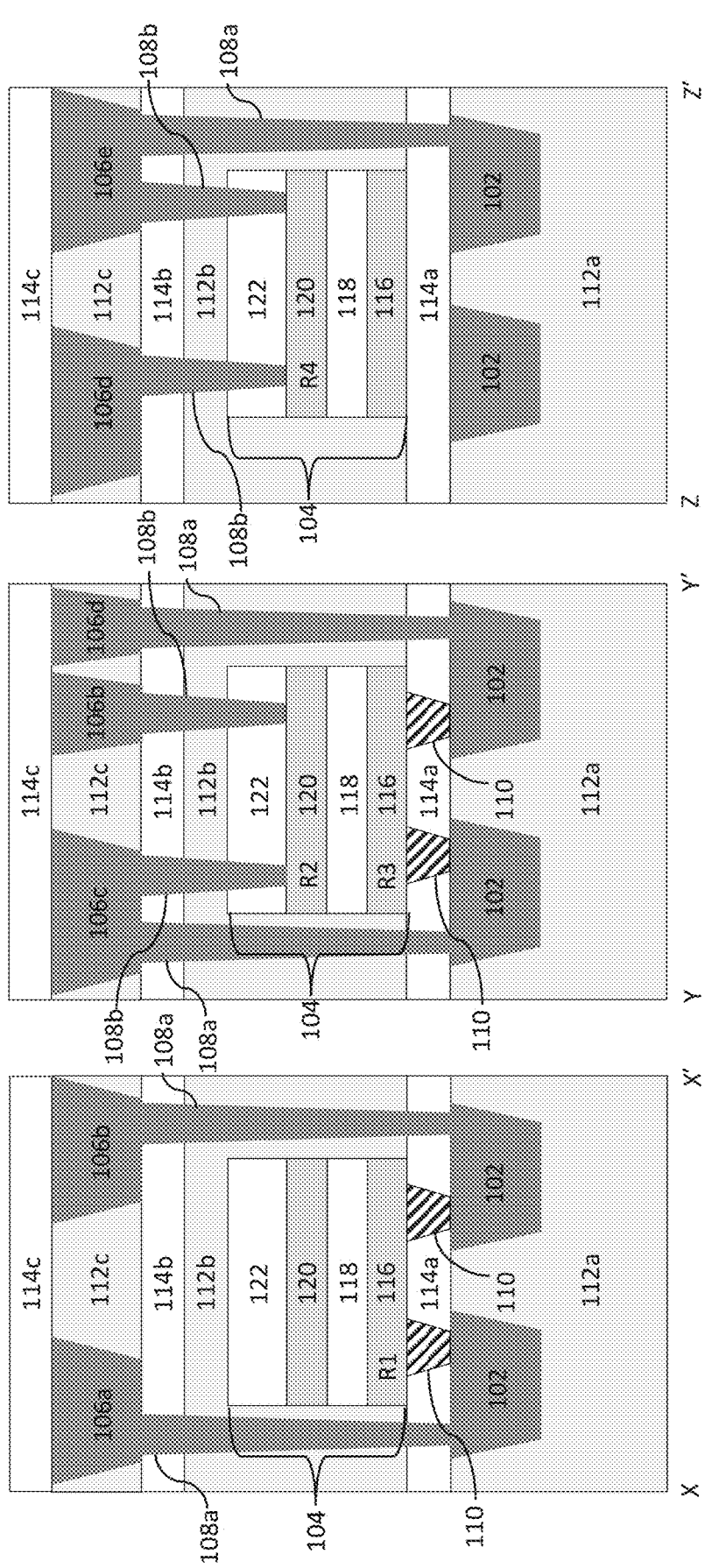
FIG. 3 illustrates a cross sectional view of the thermistor of FIG. 1.

FIG. 3 is a cross sectional view of the thermistor 100 of FIG. 1 showing three different resistor structures. The three views in FIG. 3 are taken along the lines X-X', Y-Y", and Z-Z' in FIG. 1, respectively. Also shown in FIG. 3 are the first, second, third and fourth resistors R1, R2, R3 and R4, which correspond to the same elements in the wheatstone bridge circuit show in FIG. 2.

Each of the structures in FIG. 3 includes a thin film resistor (TFR) structure 104. The TFR structures 104 comprise a lower resistor film 116, a first insulating layer 118 over the lower resistor film 116, an upper resistor film 120, and a second insulating layer 122 over the upper resistor film 120. A thickness of second insulating layer 122 may be greater than a thickness of first insulating layer 116 to facilitate the formation of upper vias 108b.

The upper and lower resistor films 120 and 116 may comprise a cermet material. Non-limiting examples of cermet materials that may be used for the resistor films are ruthenium oxide, titanium nitride, tantalum nitride, nickel chromium, silicon chromium, copper nickel, copper chromium, and carbides such as tungsten carbide and silicon carbide. The listed materials may also include impurities typically added to thin film resistors such as oxygen (O2), nitrogen (N), carbon (C), phosphorus (P), among others. The first and second insulating layers 118 and 122 may comprise a nitride material such as silicon nitride.

Each of the cermet materials of upper and lower resistor films 120 and 116 may be a negative temperature coefficient (NTC) material or a positive temperature coefficient (PTC) material. In an embodiment, one of the resistor films in a TFR structure 104 is an NTC material, and the other resistor film is a PTC material. Different temperature coefficients can enhance the sensitivity of the thermistor 100.

As seen in FIG. 3, lower metal lines 102 are located in an insulating layer 112a. Lower metal lines 102 may be part of a metal layer, e.g. M1 or M2, which is formed in a back end of line (BEOL) process. Accordingly, the lower metal lines 102 are located between metal layers Mx and Mx−1 which are located above device layers, e.g. transistor layers, that are formed in front end of line (FEOL) process, and the resistor structures 104 are within a BEOL via level. The device layers are formed on a semiconductor substrate which may comprise silicon, silicon germanium, silicon carbide, etc. as the semiconductor material. In an embodiment, the metal of lower metal lines 102 and upper metal lines 106 includes copper, insulating layers 112a-c are a silicon oxide material, and capping layers 114a-c are a nitride material such as silicon nitride.

In the structure of X-X' in FIG. 3, a first end of the lower resistor film 116 of resistor R1 is coupled to a lower metal line 102 by a first contact plug 110, and a second end of the lower resistor film 116 is coupled to a metal line 102 by a second contact plug 110. The contact plugs 110 extend through capping layer 114a. The first and second contact plugs 110 may include at least conductive material such as tantalum nitride and tungsten. Upper metal lines 106a and 106b are each coupled to lower metal lines 102 by first vias 108a, which may be Interlayer dielectric vias (IDV) or Interconnect Vias (IV). The first vias 108a extend through a capping layer 114b, an insulating layer 112b, and capping layer 114a.

In the structure shown in Y-Y' of FIG. 3, a first end of the resistor film 120 of resistor R2 is coupled to upper metal line 106c by a second via 108b, and a second end of the resistor film 120 of resistor R2 is coupled to upper metal line 106b by a second via 108b. The first end of the lower resistor film 116 of resistor R3 is coupled to a lower metal line 102 by a first contact plug 110, and a second end of the lower resistor film 116 is coupled to a metal line 102 by a second contact plug 110. Upper metal lines 106c and 106d are each coupled to lower metal lines 102 by first vias 108a.

In the structure shown in Z-Z' of FIG. 3, a first end of the resistor film 120 of resistor R4 is coupled to upper metal line 106d by a second via 108b, and a second end of the resistor film 120 of resistor R2 is coupled to upper metal line 106e by a second via 108b. Upper metal line 106e is coupled to a lower metal line 102 by a first via 108a.

Figure 4:
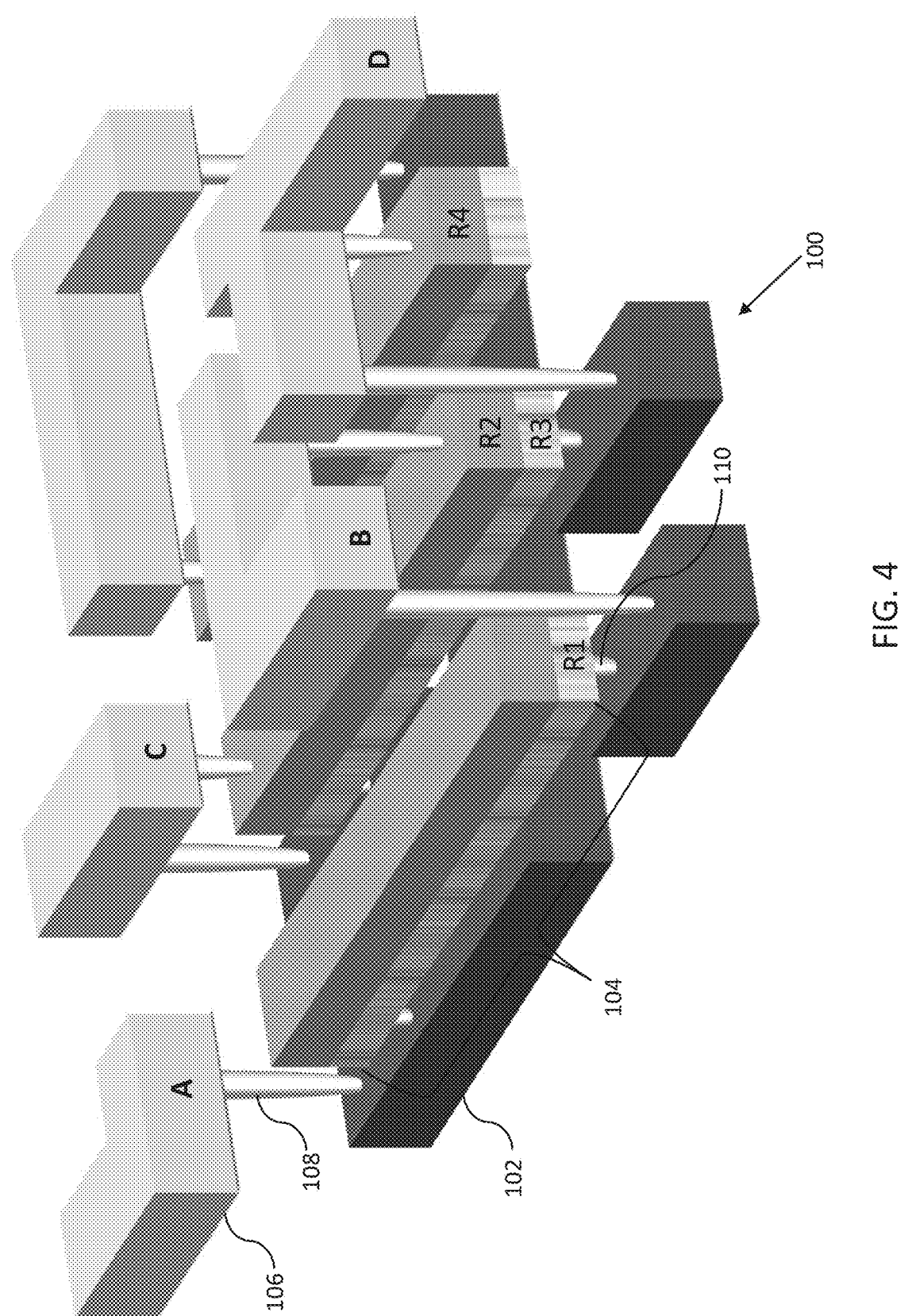
FIG. 4 illustrates an isometric view of the thermistor of FIG. 1.

FIG. 4 is an isometric view showing a three-dimensional representation of the embodiment of the thermistor 100 of FIGS. 1, 2 and 3. Resistors R1, R2, R3 and R4 in FIG. 4 correspond to the same designations in FIGS. 1, 2 and 3, and points A, B, C and D correspond to the same designations in FIGS. 1 and 2. FIG. 4 is provided to facilitate the understanding of a three dimensional arrangement of a thermistor 100.

FIGS. 5A-5F illustrate an embodiment of a process for forming the thermistor of FIGS. 1-4. The process illustrated in these figures is a BEOL process.

Figures 5A, 5B:
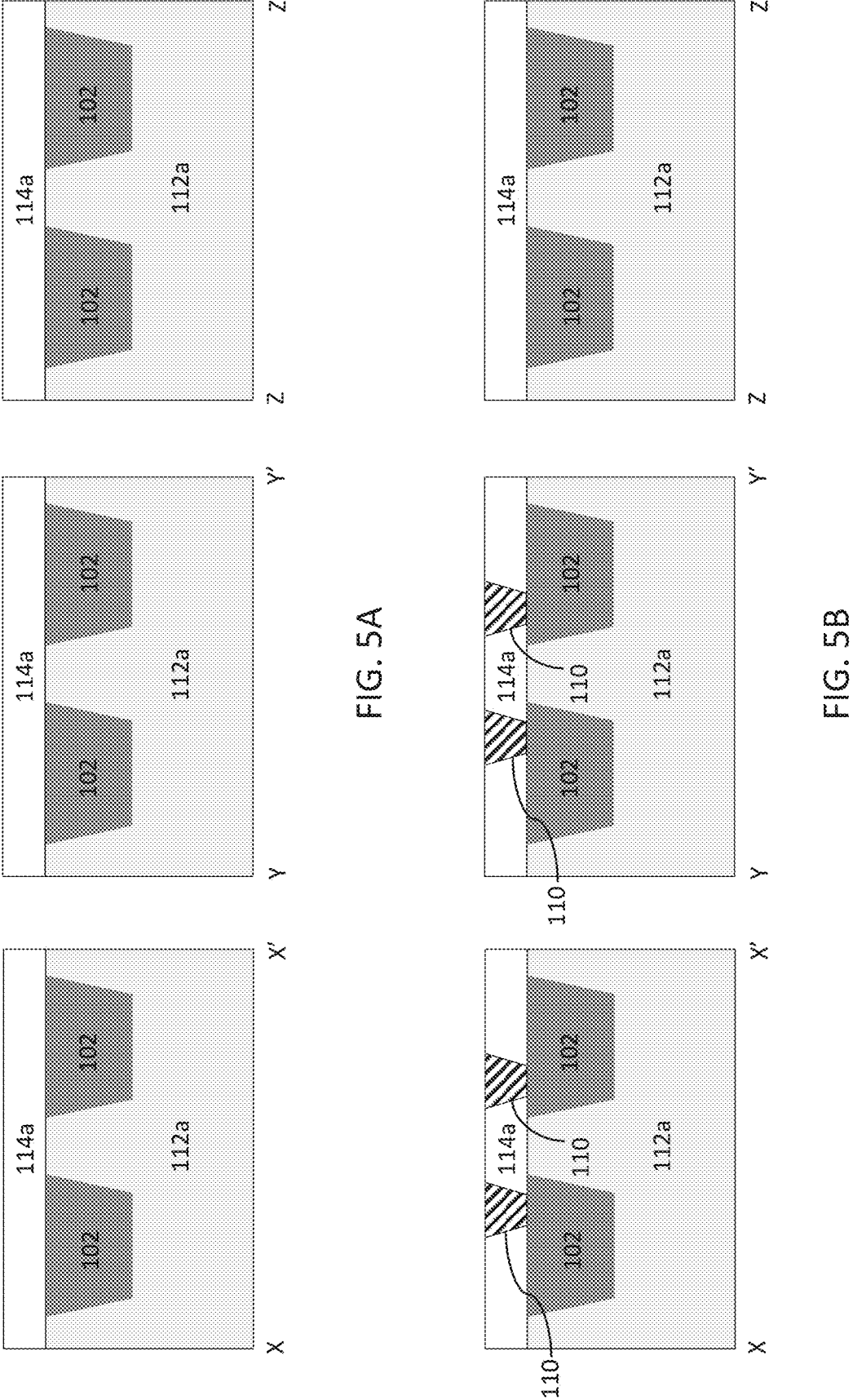
FIGS. 5A to 5F illustrate steps of an embodiment of a method of forming the thermistor of FIG. 1.

As seen in FIG. 5A, lower metal lines 102 are formed in an insulating layer 112a by a damascene process, and capping layer 114a is formed over the lower metal lines 102. For example, a mask may be formed over insulating layer 112a and used to etch openings corresponding to the metal lines 102. The openings are over-filled with a metal material, and a leveling process such as chemical mechanical polishing (CMP) is used to flatten the exposed surface. Insulating layer 112a may be a TEOS layer that is deposited over a device or transistor layer, and lower metal lines 102 may be a BEOL metal layer, e.g. M1 or M2. The metal of metal lines 102 may be copper, and capping layer 114a may be SiN.

Contact plugs 110 are formed in capping layer 114a by etching and filling plug holes in capping layer 114a using a damascene process, resulting in the structure shown in FIG. 5B. The plug holes may be filled with a conductive material such as tantalum nitride or tungsten.

Figures 5C, 5D:
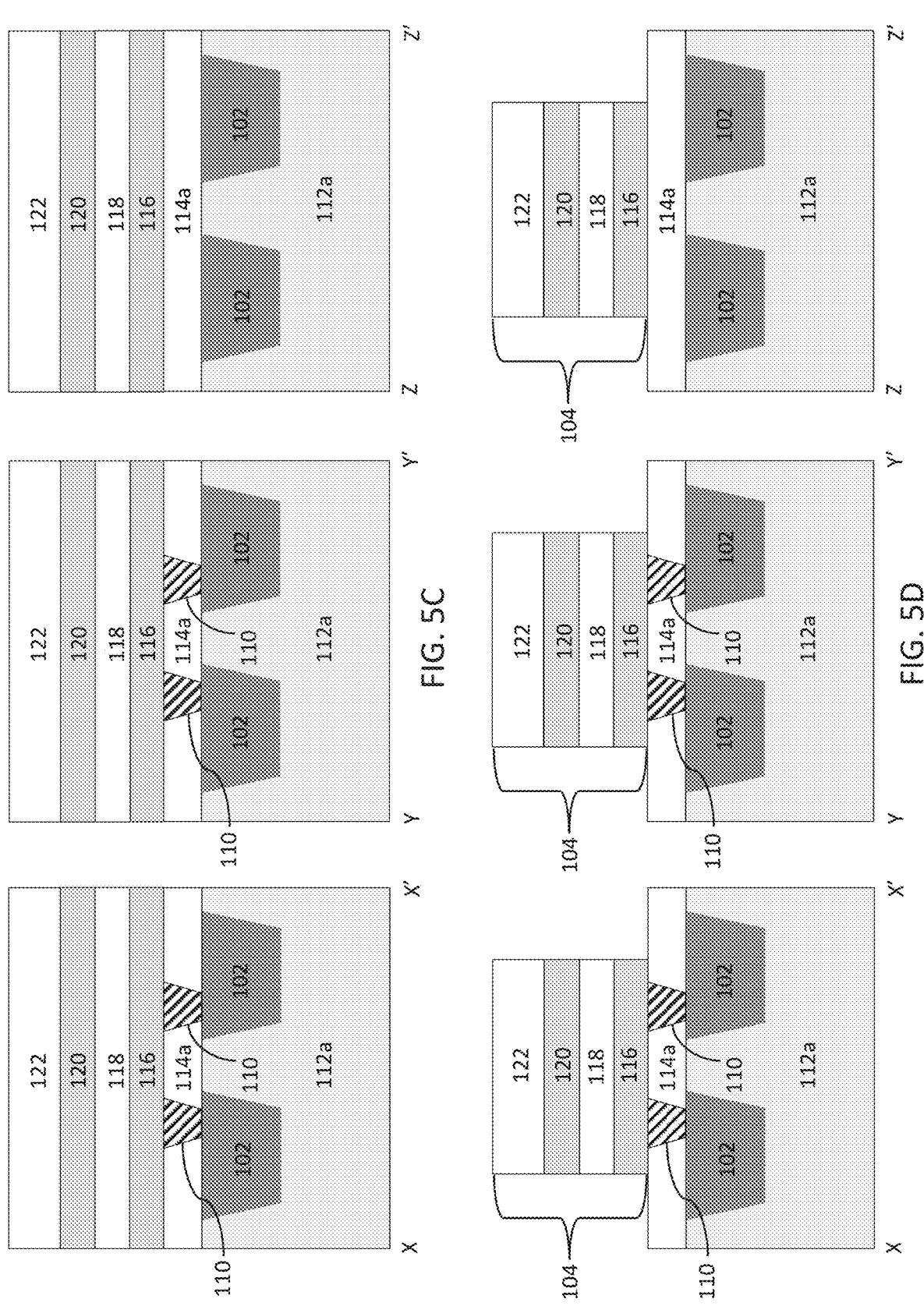

Turning to FIG. 5C, a lower resistor film 116 is formed over capping layer 114a. A first insulating layer 118 is formed over the lower resistor film 116, an upper resistor film layer 120 is formed over the first insulating layer 118, and a second insulating layer 122 is formed over the upper resistor film 120. The upper and lower restive films 116 and 120 may comprise one or more cermet material such as ruthenium oxide, tantalum nitride, nickel chromium, silicon chromium, and carbides such as tungsten carbide and silicon carbide. The first and second insulating layers 118 and 122 may be silicon nitride. Each of the resistor films and insulating layers 116 to 122 may be formed using an in-situ deposition process as known in the art, and may comprise more than one layer of material.

The process conditions used to form lower resistor film 116 may be different from the process conditions used to form upper resistor film 120. For example, one or both of the oxygen flow rate and deposition times used to form the two films may be different to change the thickness and oxygen content so that the films have different resistance characteristics. Accordingly, lower resistor film 116 may have a different thickness and/or composition from upper resistor film 120.

In an embodiment, the material of lower resistor film 116 is different from the material of upper resistor film 120. For example, one of the resistor films may be an NTC material, and the other resistor film may be a PTC material.

The temperature coefficient of resistance (TCR) value of lower resistor film 116 and upper resistor film 120 may be within the range of +/−5000 ppm/C. The difference between the TCR values of the two films may be 500 ppm/C or greater, 1000 ppm/C or greater, or 1500 ppm/C or greater, for example.

The deposition time used to form the second insulating layer 122 may be greater than the deposition time used to form the first insulating layer 118. Accordingly, the thickness of the second insulating layer 122 may be greater than the thickness the first insulating layer 118 to facilitate vias 108 that are formed in second insulating layer 122 in a subsequent process.

Figure 5E:
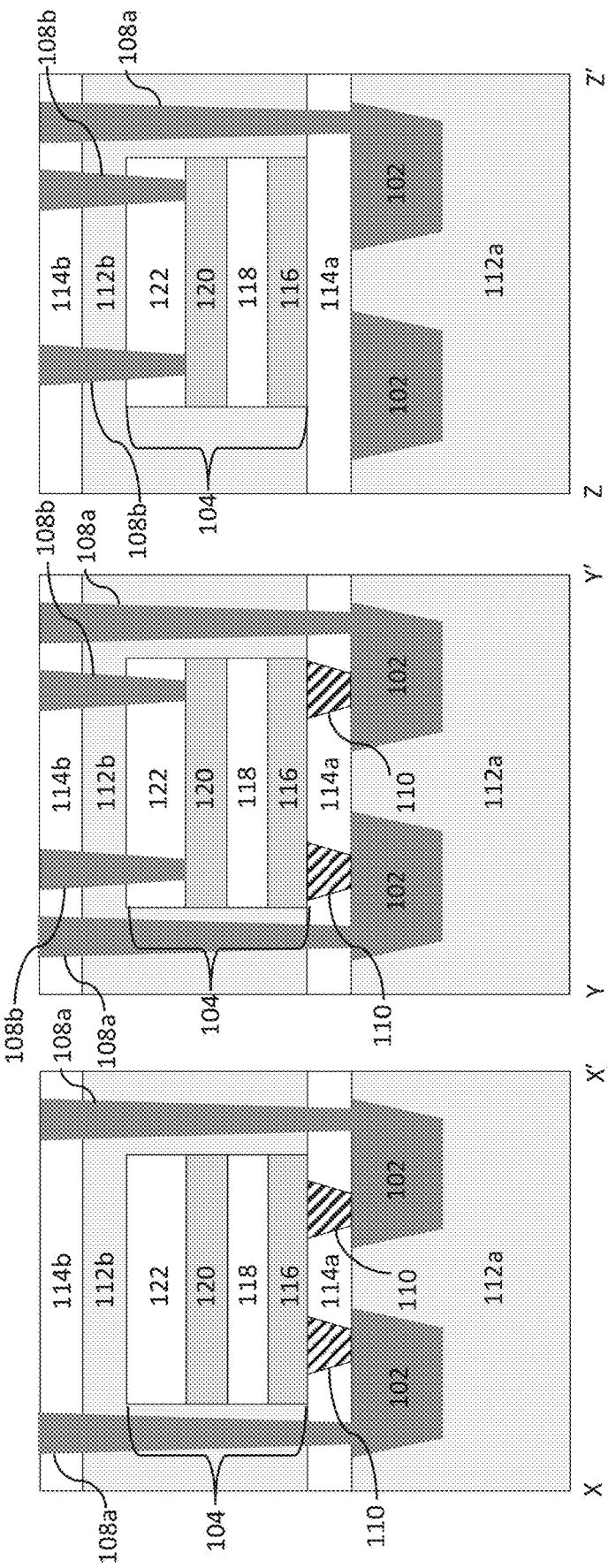
Figure 5F:
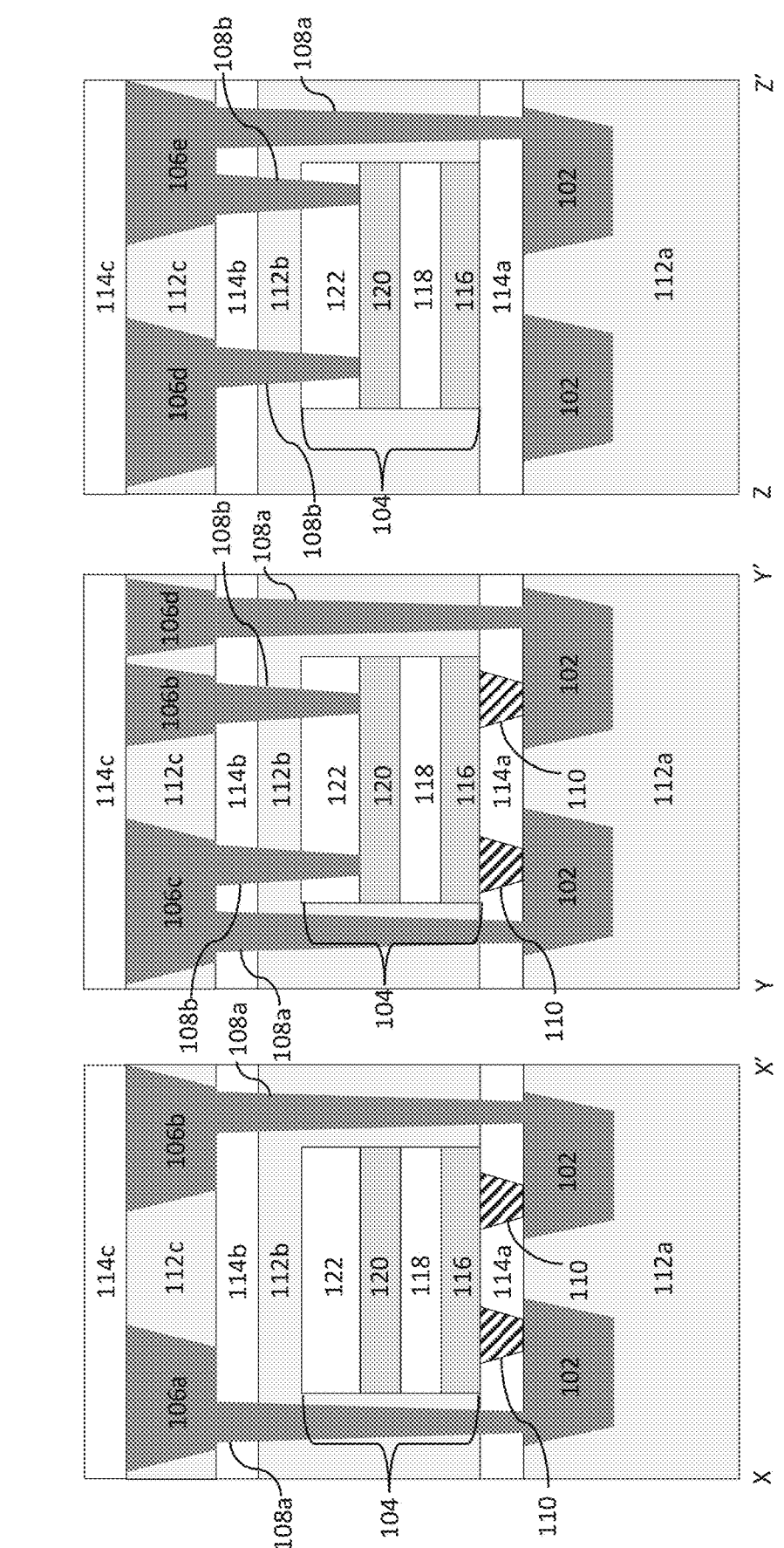

An etch mask is formed over second insulating layer 122 of the structures shown in FIG. 5C, and an etching process is performed to form the TFR structures 104 shown in FIG. 5D. As shown in FIG. 5E, an insulating layer 112b is formed over the TFR structures 104, and capping layer 114b is formed over insulating layer 112b. A leveling process such as CMP may be performed on insulating layer 112b before depositing capping layer 114b. Insulating layer 112b may be formed of a TEOS material, and capping layer 114b may be formed of silicon nitride.

Vias 108a and 108b are formed by etching via holes using conventional mask patterning and etch processes as known in the art and depositing a conductive material in the via holes. The conductive material may be copper. A leveling process such as CMP may be performed after depositing the conductive material to form the structures shown in FIG. 5E.

A third layer 112c of insulating material, e.g. a TEOS material, is formed over the structures in FIG. 5E, and upper metal lines 106b are formed in the insulating material 112c using a damascene process. The upper metal lines 106 may be part of a metal layer that is one level above the metal layer of lower metal lines 102. For example, when lower metal lines 102 are metal layer M1, upper metal lines 106 may be metal layer M2, and when lower metal lines 102 are metal layer M3, upper metal lines 106 may be metal layer M4. The upper metal lines 106 may be a copper material. Finally, capping layer 114c is formed over upper metal lines 106.

Figure 6:
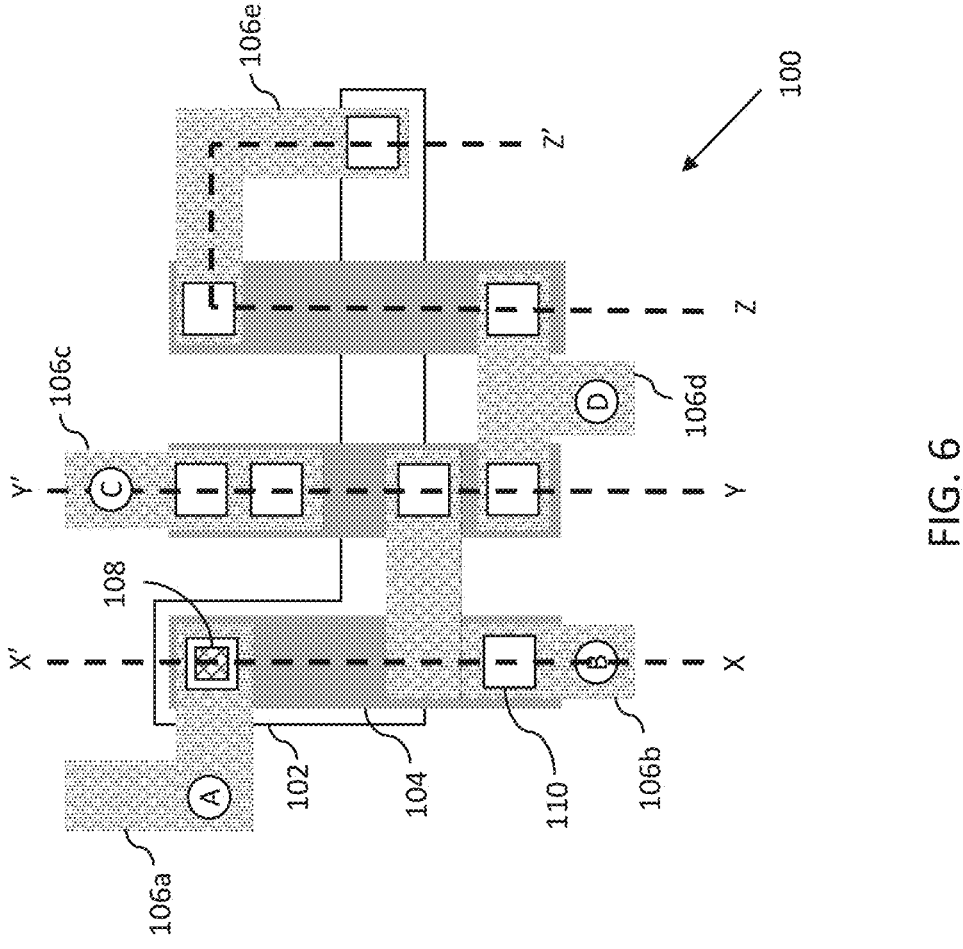
FIG. 6 illustrates a layout diagram of a second embodiment of a thermistor.
Figure 7:
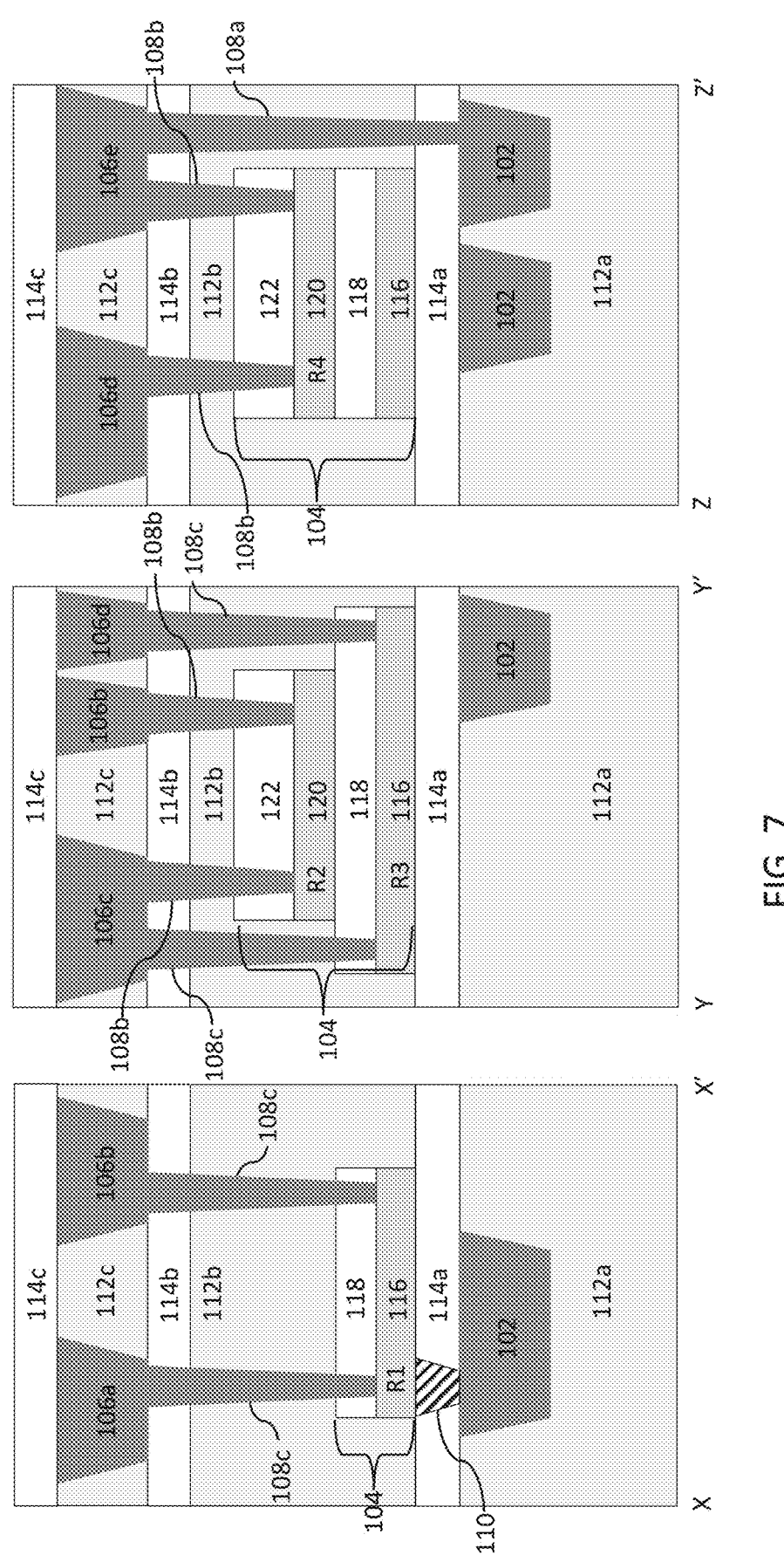
FIG. 7 illustrates a cross sectional view of the thermistor of FIG. 6.

FIG. 6 is a layout view illustrating a second embodiment of a thermistor 100, and FIG. 7 is a cross sectional view of the second embodiment of FIG. 6 showing three different resistor structures. The three views in FIG. 7 are taken along the lines X-X', Y-Y', and Z-Z" in FIG. 6, respectively. Also shown in FIG. 7 are the first, second, third and fourth resistors R1, R2, R3 and R4, which correspond to the same elements in the wheatstone bridge circuit shown in FIG. 2.

In structure X-X' of FIG. 7, a first end of the lower resistor film 116 of resistor R1 is coupled to a lower metal line 102 by a contact plug 110. The first end of the lower resistor film 116 of resistor R1 is further coupled to upper metal line 106a by a via 108c, and a second end of the lower resistor film 116 of resistor R1 is coupled to upper metal line 106b by another via 108c. The TFR structure 104 in structure X-X' includes a lower resistor film 116 and a first insulating layer 118, and the first insulating layer 118 is the uppermost layer. The via 108c extend through the first insulating layer 118, so the first insulating layer 118 of the second embodiment may have a greater thickness than the first insulating layer 118 of the first embodiment.

In structure Y-Y' of FIG. 7, a first end of the lower resistor film 116 of resistor R3 is coupled to upper metal line 106c by a via 108c, and a second end of the lower resistor film 116 of resistor R3 is coupled to upper metal line 106d. Similarly, a first end of the upper resistor film 120 of resistor R2 is coupled to upper metal line 106c by a via 108b, and a second end of the upper resistor film 120 of resistor R2 is coupled to upper metal line 106b by another via 108b.

In structure Z-Z' of FIG. 7, a first end of the upper resistor film 120 of resistor R4 is coupled to upper metal line 106d by a via 108b, and a second end of the upper resistor film 120 of resistor R4 is coupled to upper metal line 106e. Upper metal line 106e is further coupled to lower metal line 102 by a via 108a.

Figures 8A, 8B:
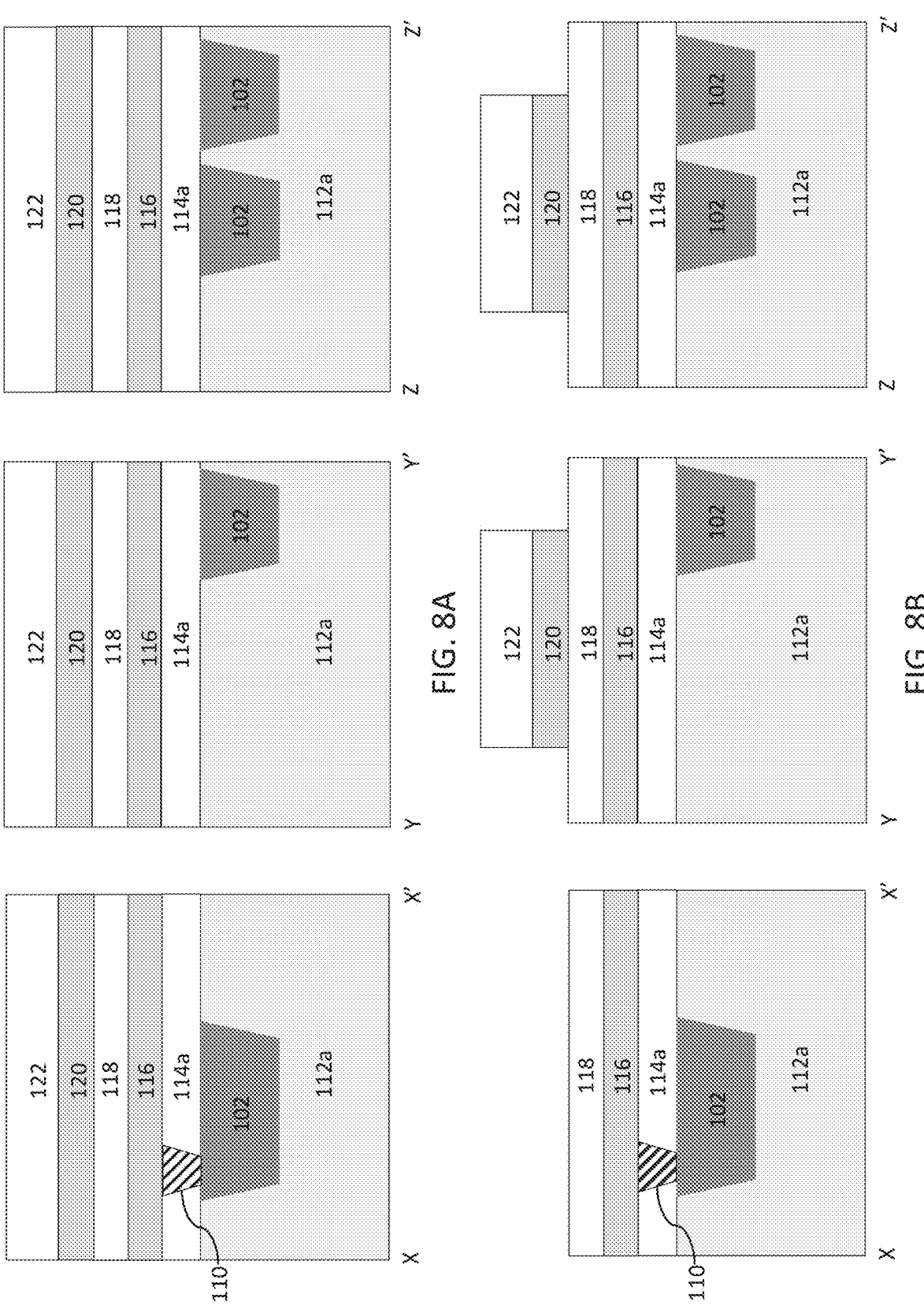
FIGS. 8A to 8C illustrate steps of an embodiment of a method of forming the thermistor of FIG. 6.
Figure 8C:
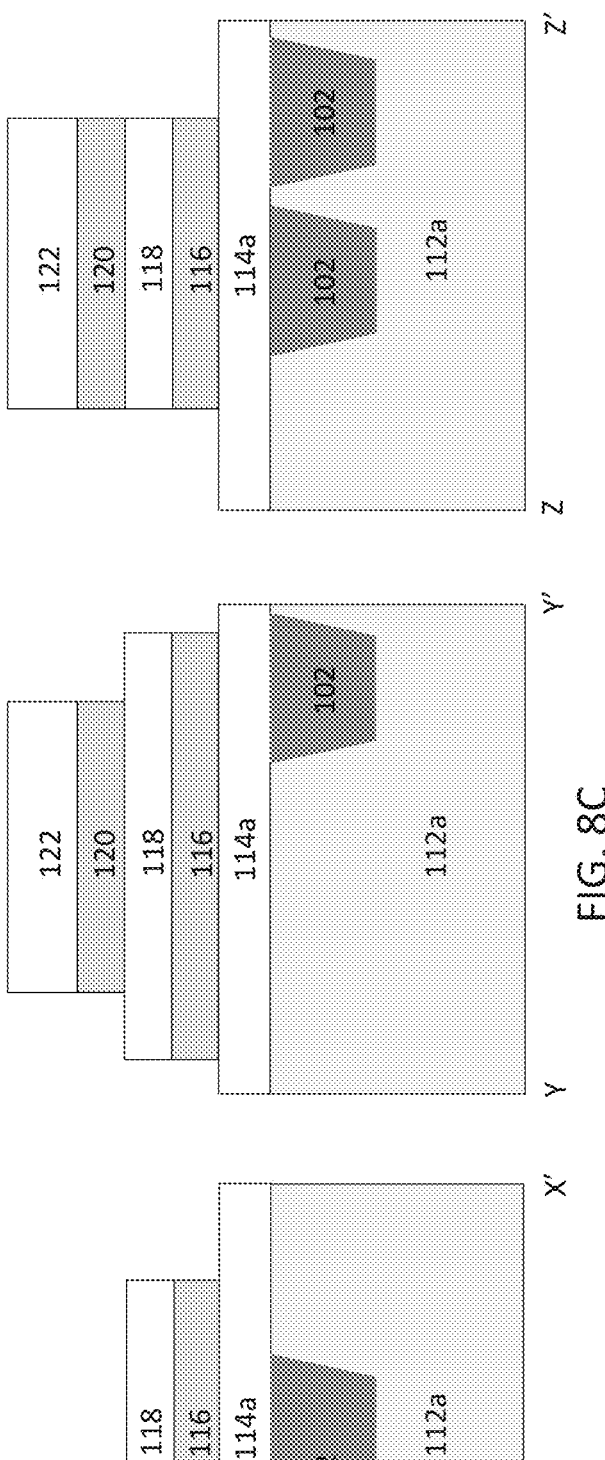

The embodiment shown in FIGS. 7 and 8 may be formed using similar etching, deposition and leveling techniques as described above with respect to FIGS. 5A-5F. One difference from the process of FIGS. 5A-5F is that additional masking and etching is performed to form the structure in FIGS. 7 and 8. An example of the additional masking and etching is illustrated in FIGS. 8A-8C.

As illustrated in FIG. 8A, upper and lower resistor films 116 and 120 and first and second insulating layers 118 and 122 are formed over a capping layer 114a using similar techniques described above with respect to FIGS. 5A to 5C. A first etch mask is formed over second insulating layer 122 and an etching process is performed to completely remove the upper resistor film 120 and the second insulating layer 122 from structure X-X', and to shape the resistor film 120 and the second insulating layer 122 in structures Y-Y' and Z-Z' as seen in FIG. 8B. After the first etching process, a second etch mask is formed and used to etch lower resistor film 116 and second insulating layer 118, resulting in the structure shown in FIG. 8C. Subsequently, an insulating layer 112b is formed over the structures of FIG. 8C, a capping layer 114b is formed over the insulating layer 112b, vias 108b and 108c are formed to contact the resistor films, and metal lines 106a-e, insulating layer 112c and capping layer 114c are formed to complete the structure show in FIG. 7.

Figure 9:
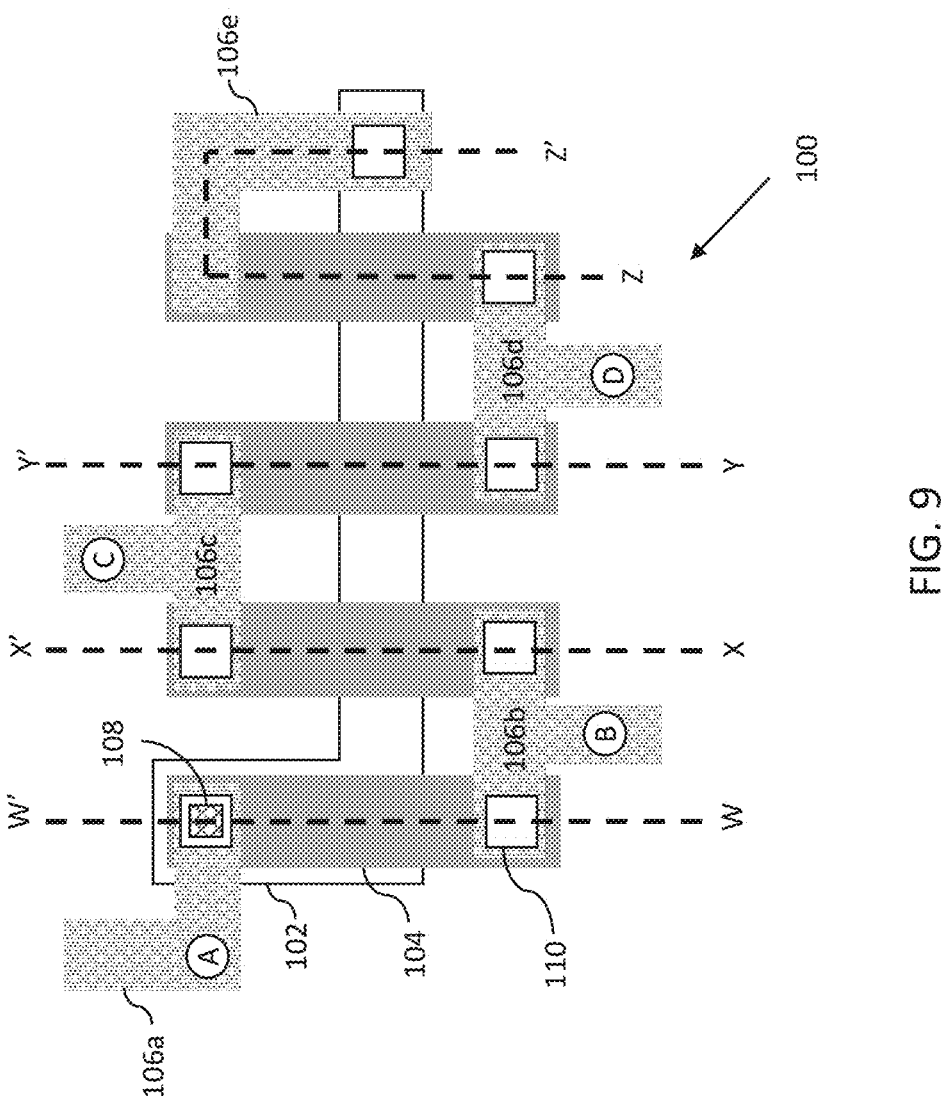
FIG. 9 illustrates a layout diagram of a third embodiment of a thermistor.
Figure 10:
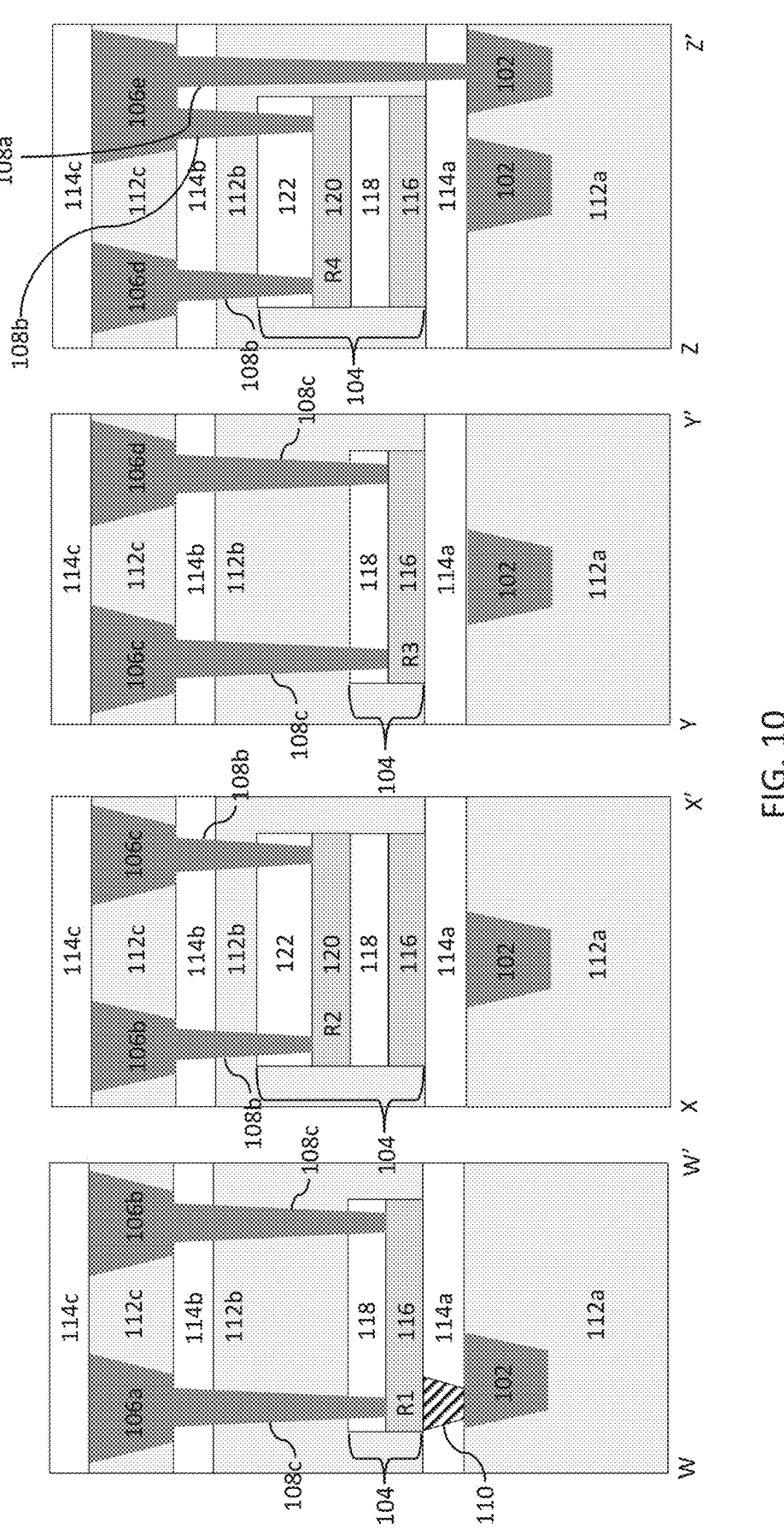
FIG. 10 illustrates a cross sectional view of the thermistor of FIG. 9.

FIG. 9 is a layout view illustrating a third embodiment of a thermistor 100, and FIG. 10 is a cross sectional view of the thermistor 100 of FIG. 9 showing four different resistor structures. The four views in FIG. 10 are taken along the lines W-W', X-X', Y-Y', and Z-Z" in FIG. 9, respectively. Also shown in FIG. 10 are the first, second, third and fourth resistors R1, R2, R3 and R4, which correspond to the same elements in the wheatstone bridge circuit shown in FIG. 2.

In structure W-W' of FIG. 10, a first end of the lower resistor film 116 of resistor R1 is coupled to a lower metal line 102 by a first contact 'plug 110. The first end of the lower resistor film 116 of resistor R1 is further coupled to upper metal line 106a by a via 108c, and a second end of the lower resistor film 116 of resistor R1 is coupled to upper metal line 106b by another via 108c. The TFR structure 104 in structure W-W' includes a lower resistor film 116 and a first insulating layer 118, and the first insulating layer 118 is the uppermost layer. The vias 108c extend through the first insulating layer 118, so the first insulating layer 118 of the third embodiment may have a greater thickness than the first insulating layer 118 of the first embodiment.

In structure X-X' of FIG. 10, a first end of the upper resistor film 120 of resistor R2 is coupled to upper metal line 106b by a via 108b, and a second end of the upper resistor film 120 of resistor R2 is coupled to upper metal line 106c by another via 108b.

In structure Y-Y' of FIG. 10, a first end of the lower resistor film 116 of resistor R3 is coupled to upper metal line 106c by a via 108c, and a second end of the lower resistor film 116 of resistor R3 is coupled to upper metal line 106d by another via 108c.

Finally, in structure Z-Z' of FIG. 10, a first end of the upper resistor film 120 of resistor R4 is coupled to upper metal line 106d by a via 108b, and a second end of the upper resistor film 120 of resistor R4 is coupled to upper metal line 106e by another via 108c. Upper metal line 106e is also coupled to a lower metal line 102 by a via 108a.

The third embodiment illustrated in FIGS. 9 and 10 may be formed using similar etching, deposition and leveling techniques as described above with respect to FIGS. 5A-5F, except that two etching processes may be used. In particular, a first etch step may be performed to remove portions of second insulating layer 122, upper resistor film 120, first insulating layer 118 and lower resistor film 116 similar to the process illustrated in FIG. 5D, and a second etching process may be performed to remove the second insulating layer 122 and upper resistor film 120 from the structures shown in W-W' and Y-Y' in FIG. 10 without removing second insulating layer 122 and upper resistor film 120 from the structures shown in X-X' and Z-Z'.

Figure 11:
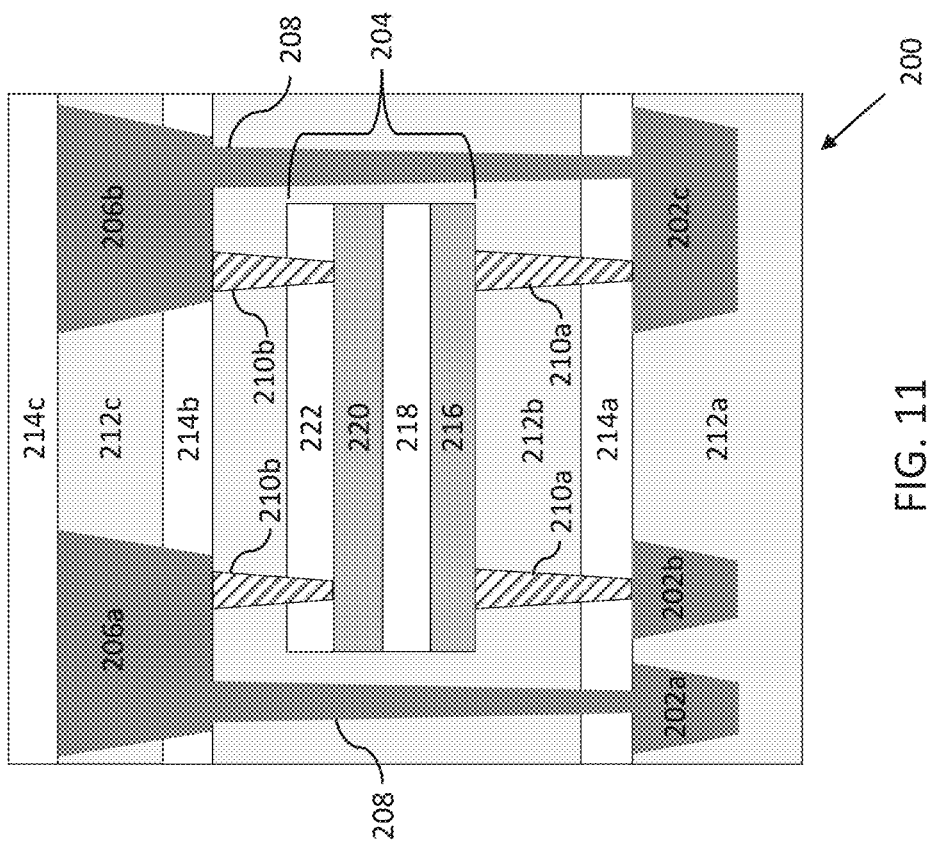
FIG. 11 illustrates a resistor circuit according to an embodiment.

FIG. 11 illustrates a resistor circuit 200 according to an embodiment of the present disclosure. The resistor circuit 200 includes a TFR 204 that comprises a lower resistor film 216, a first insulating layer 218 over the lower resistor film 216, an upper resistor film 220, and a second insulating layer 222 over the upper resistor film 220.

The upper and lower resistor films 220 and 216 may comprise a cermet material. Non-limiting examples of cermet materials that may be used for the resistor films are ruthenium oxide, tantalum nitride, nickel chromium, silicon chromium, and carbides such as tungsten carbide and silicon carbide. The first and second insulating layers 218 and 222 may include a nitride material such as silicon nitride. In an embodiment, the upper and lower resistor films 220 and 216 have the same material, thickness and shape so that they have the same electrical characteristics.

A first end of the upper resistor film 220 is coupled to a first upper metal line 206a by an upper contact 210b, and a second end of the upper resistor film 220 is coupled to a second upper metal line 206b by another upper contact 210b. The upper contacts 210b are formed of a conductive material such as tungsten or tantalum nitride, and the upper metal lines 206a and 206b are metal lines in a BEOL metal layer. Accordingly, upper metal lines 206a and 206b may be a copper material. In an embodiment, the metal layer of upper metal lines 206 is the uppermost metal layer.

Upper metal lines 206a and 206b are respectively coupled to lower metal lines 202a and 202c by vias 208. The lower metal lines 202a and 202c may be metal lines of a BEOL metal layer one level below the upper metal lines 206. For example, if upper metal lines 206 are in metal layer M7, lower metal lines 202 are in metal layer M6.

The first end of the lower resistor film 216 is coupled to lower metal line 202b by a lower contact 210a, and the second end of the lower resistor film 216 is coupled to a second lower metal line 202c by another lower contact 210a. The lower contacts 210a may be the same material as upper contacts 210b, e.g. TaN or W.

Figure 12:
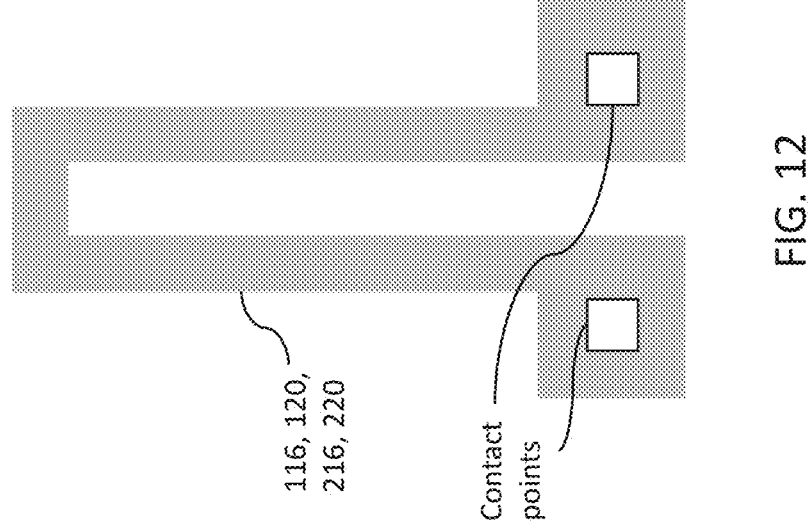
FIG. 12 illustrates a top view of a resistor film structure according to an embodiment.

FIG. 12 illustrates a top view of a resistor film that may represent any of resistor films 216, 220, 116 and 120. The resistor film in FIG. 12 has a two-dimensional shape with a turn, thereby providing a longer electrical path and higher resistance than would be achieved by a resistor film in a straight line between the two contact points. While the resistor film in FIG. 12 only has a single turn, in other embodiments, multiple turns may be present in a serpentine configuration to provide higher resistance values.

FIGS. 13A-13F illustrate an embodiment of a process for forming the TFR circuit of FIG. 11. The process illustrated in these figures is a BEOL process. The process of FIGS. 13A-13F is similar to the process of FIGS. 5A-5F. Accordingly, in the following description, emphasis is placed on the differences between these processes and details of similar processes are limited for the sake of brevity.

Figure 13B:
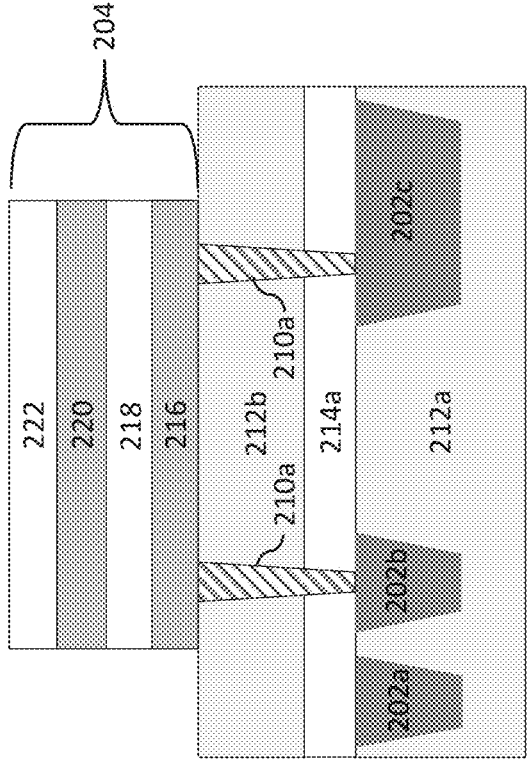
FIG. 13A to 13D illustrate steps of an embodiment of a method of forming the resistor circuit of FIG. 11.
Figure 13A:
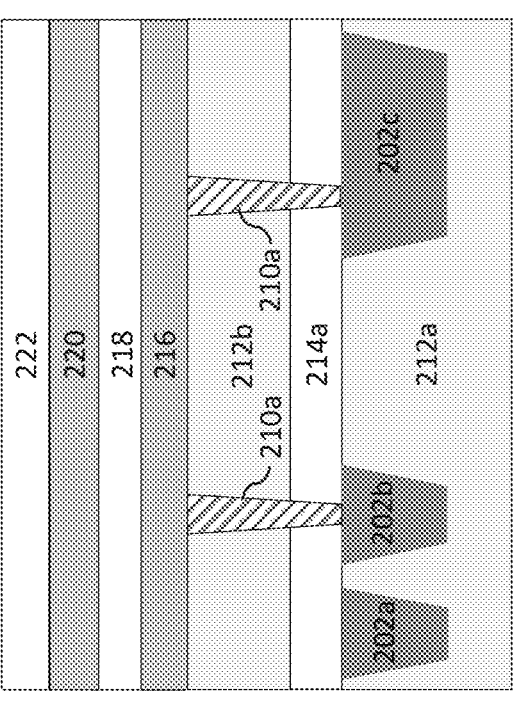

As seen in FIG. 13A, lower metal lines 202 are formed in an insulating layer 212a by a damascene process, and capping layer 214a is formed over the lower metal lines 202. Insulating layer 212a may be a TEOS material that is deposited over a device or transistor layer, and lower metal lines 202 are a BEOL metal layer. The metal of metal lines 202 may be copper, and capping layer 214a may be SiN. Lower contacts 210a are formed by etching contact holes that extend through insulating layer 212b and capping layer 214a, over-filling the contact holes with a conductive material such as W or TaN, and performing a levelling process such as CMP.

A lower resistor film 216 is deposited over the leveled insulating layer 212b, an insulating layer 218 is formed over the etched lower resistor film 216, an upper resistor film 220 is deposited over the leveled insulating layer 218, and an insulating material of second insulating layer 222 is deposited over upper resistor film 220. The films are etched using an etch mask to form the structure in FIG. 13B. The etch mask may have a two-dimensional shape with at least one turn as seen in FIG. 12.

Figure 13D:
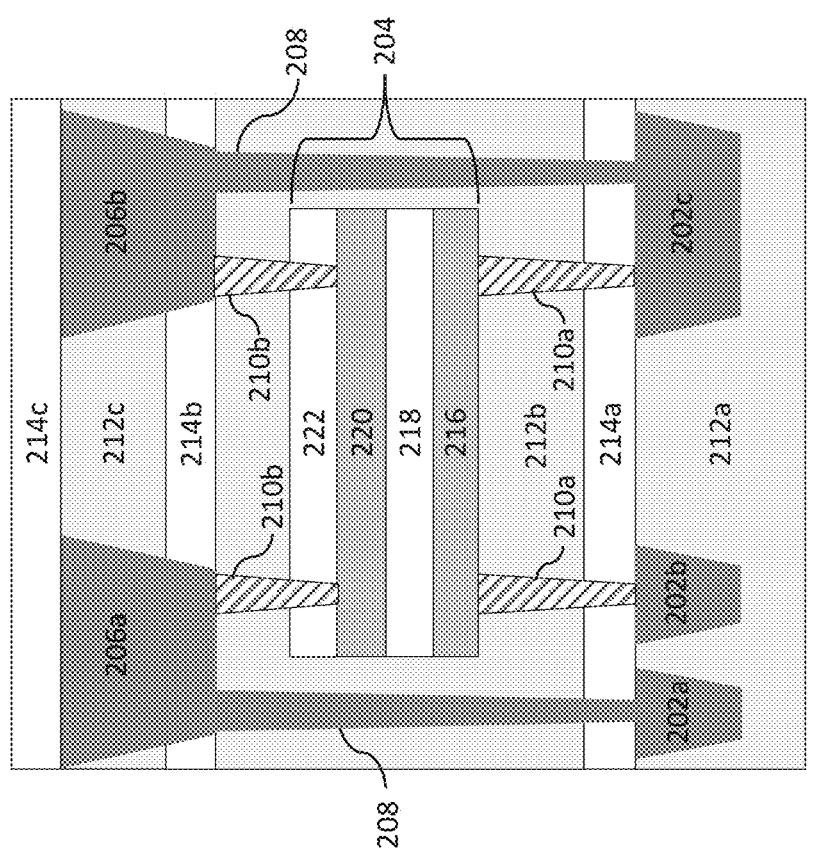
Figure 13C:
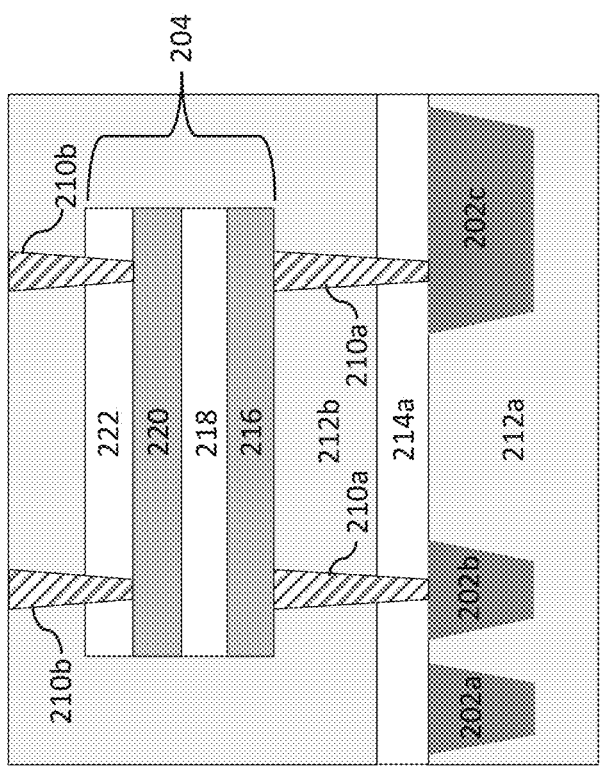

As shown in FIG. 13C, an insulating material such as a TEOS material is deposited over TFR structure 204 and levelled to form insulating layer 212b. Contact holes are etched through insulating layer 212b and second insulating layer 222 to contact upper resistor film 220, and the contact holes are filled with a conductive material such as W or TaN to form upper contacts 210b as illustrated in FIG. 13D.

A capping layer 214b and insulating layer are formed over insulating layer 212b, and etching processes are performed to form openings for metal lines 206 and via holes for vias 208 using two different etch masks. The via holes and openings are filled with a copper material, a leveling process is performed, and a capping layer 214c is formed over the metal lines 206 to complete the structure shown in FIG. 13F. The material of capping layers 214b and 214c may be SiN, vias and upper metal lines 206 may be copper materials, and insulating layer 212c may be a TEOS layer, for example.

Figure 14:
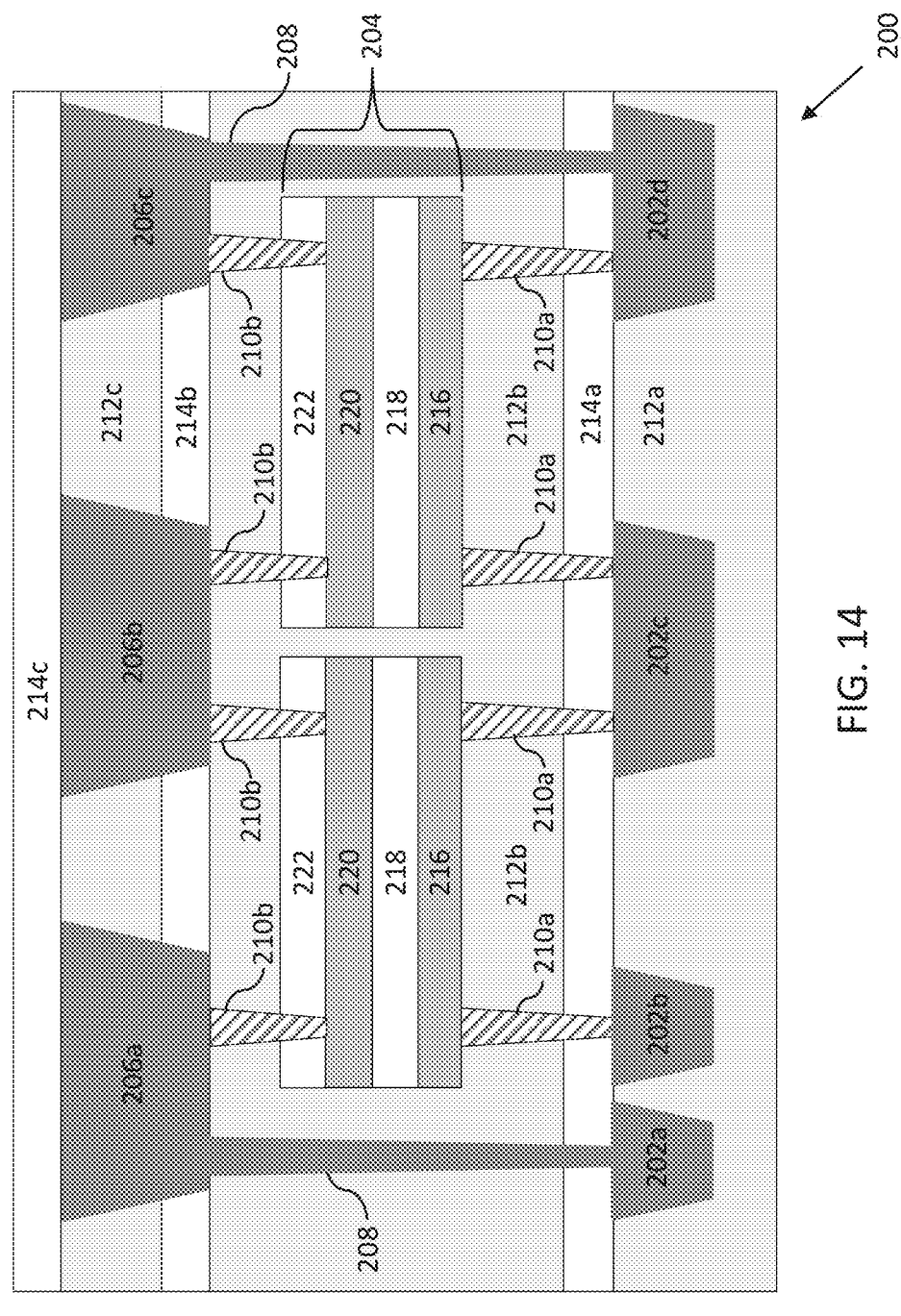
FIG. 14 illustrates an embodiment of a resistor circuit with four resistors arranged in series.

In an embodiment, a plurality of TFR structures 204 may be coupled in series in a BEOL via layer to achieve a desired resistance level of a resistor circuit 200. While the embodiment in FIG. 11 illustrates a resistor circuit 200 with two resistors (216 and 220) in series, the embodiment of FIG. 14 illustrates an embodiment with four resistors arranged in series. It should be appreciated that embodiments can include any number of TFR structures 204 arranged in series in a similar manner as shown in FIG. 14.

Embodiments of the present disclosure have several advantages over conventional structures. Embodiments are formed in a BEOL via layer, increasing the degree of integration compared to devices that are formed in an FEOL layer. Embodiments are highly scalable, and can have different materials and shapes to achieve desired resistive characteristics. Embodiments can be applied to different technology nodes using a limited number of processing steps.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

The invention claimed is:

1. An apparatus comprising:
a thin film resistor structure within a back end of line (BEOL) via level, the thin film resistor structure comprising:
a lower resistor film;
a first insulating layer over the lower resistor film;
an upper resistor film over the first insulating layer; and
a second insulating layer over the upper resistor film, and first and second upper metal lines above the second insulating layer,
wherein a first end of the upper resistor film is coupled to the first upper metal line by a first upper via, and a second end of the upper resistor film is coupled to the second upper metal line by a second upper via,
wherein a width of the lower resistor film is the same as a width of the first insulating layer, and a width of the upper resistor film is the same as a width of the second insulating layer.

2. The apparatus of claim 1, wherein a temperature coefficient of resistance of the lower resistor film is different from a temperature coefficient of resistance of the upper resistor film.

3. The apparatus of claim 2, wherein one of the upper and lower resistive films has a negative temperature coefficient, and the other of the upper and lower resistive films has a positive temperature coefficient.

4. The apparatus of claim 1, wherein the lower resistor film includes a first cermet material and the upper resistor film includes a second cermet material.

5. The apparatus of claim 4, wherein each of the first and second cermet materials includes one or more of ruthenium oxide, tantalum nitride, nickel chromium, silicon chromium, tungsten carbide and silicon carbide.

6. The apparatus of claim 1, wherein the upper resistor film is a resistive element in a thermistor device.

7. The apparatus of claim 1, wherein a thickness of the first insulating layer is less than a thickness of the second insulating layer.

8. An apparatus comprising:
a thin film resistor structure within a back end of line (BEOL) via level, the thin film resistor structure comprising:
a lower resistor film;
a first insulating layer over the lower resistor film;
an upper resistor film over the first insulating layer; and
a second insulating layer over the upper resistor film, and first and second upper metal lines above the second insulating layer,
wherein a first end of the upper resistor film is coupled to the first upper metal line by a first upper contact, and a second end of the upper resistor film is coupled to the second upper metal line by a second upper contact,
wherein a width of the lower resistor film is the same as a width of the first insulating layer, and a width of the upper resistor film is the same as a width of the second insulating layer.

9. The apparatus of claim 8, wherein the lower resistor film and the upper resistor film are made of the same material.

10. The apparatus of claim 9, wherein the material of the upper and lower resistor films is a cermet material.

11. The apparatus of claim 10, wherein the cermet material includes one or more of ruthenium oxide, tantalum nitride, nickel chromium, silicon chromium, tungsten carbide and silicon carbide.

12. The apparatus of claim 8, wherein a first end of the lower resistor film is coupled to a first lower metal line by a first lower contact, and a second end of the lower resistor film is coupled to a second lower metal line by a second lower contact.

13. The apparatus of claim 12, wherein the first and second lower vias include at least one of tantalum nitride and tungsten, and the first and second upper vias include copper.

14. The apparatus of claim 8, wherein the upper and lower resistor films have a flat two-dimensional shape with at least one turn.

15. A method comprising:
forming a lower metal layer including first and second lower metal lines;
forming a thin film resistor structure by:
forming a lower resistor film over the lower metal layer;
forming a first insulating layer over the first resistor film;
forming an upper resistor film over the first insulating layer; and
forming a second insulating layer over the second resistor film,
forming first and second upper vias that extend through the upper resistor film to contact first and second ends of the upper resistor film, respectively; and
forming first and second upper metal lines coupled to the first and second upper vias, respectively,
wherein a width of the lower resistor film is the same as a width of the first insulating layer, and a width of the upper resistor film is the same as a width of the second insulating layer.

16. The method of claim 15, wherein a temperature coefficient of resistance of the lower resistor film is different from a temperature coefficient of resistance of the upper resistor film.

17. The method of claim 16, wherein one of the upper and lower resistive films has a negative temperature coefficient, and the other of the upper and lower resistive films has a positive temperature coefficient.

18. The method of claim 15, wherein the lower resistor film includes a first cermet material and the upper resistor film includes a second cermet material.

19. The method of claim 18, wherein each of the first and second cermet materials includes one or more of ruthenium oxide, tantalum nitride, nickel chromium, silicon chromium, tungsten carbide and silicon carbide.

20. The apparatus of claim 15, wherein the second insulating layer is formed to have a greater thickness than the first insulating layer.

* * * * *